United States Patent [19]
Sato et al.

[11] Patent Number: 5,517,454
[45] Date of Patent: May 14, 1996

[54] SEMICONDUCTOR MEMORY DEVICE HAVING REFRESH CIRCUITS

[75] Inventors: Katsuhiko Sato, Yokohama; Kiyofumi Ochii, Koganei, both of Japan; Yukihiro Urakawa, Sunnyvale, Calif.

[73] Assignee: Kabushiki Kaisha Toshiba, Kanagawa, Japan

[21] Appl. No.: 355,762

[22] Filed: Dec. 14, 1994

[30] Foreign Application Priority Data

Dec. 27, 1993 [JP] Japan ..................... 5-332770

[51] Int. Cl.$^6$ ............................................. G11C 7/00
[52] U.S. Cl. ............................ 365/222; 365/203
[58] Field of Search ........................ 365/222, 203, 365/204, 189.05, 189.09, 236

[56] References Cited

U.S. PATENT DOCUMENTS

| | | | |
|---|---|---|---|
| 4,870,622 | 9/1989 | Aria et al. | 365/230.03 |
| 4,943,960 | 7/1990 | Komatsu et al. | 365/222 |
| 5,343,430 | 8/1994 | Furuyama | 365/222 |

*Primary Examiner*—Tan T. Nguyen
*Attorney, Agent, or Firm*—Loeb and Loeb

[57] ABSTRACT

A semiconductor memory device including dynamic memory cells for which refresh operation is required, wherein one fundamental cycle consists of a normal operation for carrying out writing or reading into or from the memory cells and a refresh operation. This semiconductor memory device comprising: a refresh signal generating circuit supplied with a clock signal to generate a refresh signal indicating start of refresh; a count signal generating circuit supplied with the clock signal to generate a count signal required for selection of a memory cell to be refreshed, a refresh counter circuit supplied with the refresh signal and the count signal to select a word line and a bit line to which a memory cell to be refreshed is connected; and a precharge circuit supplied with the refresh signal to carry out precharge of the bit line for refresh.

4 Claims, 9 Drawing Sheets

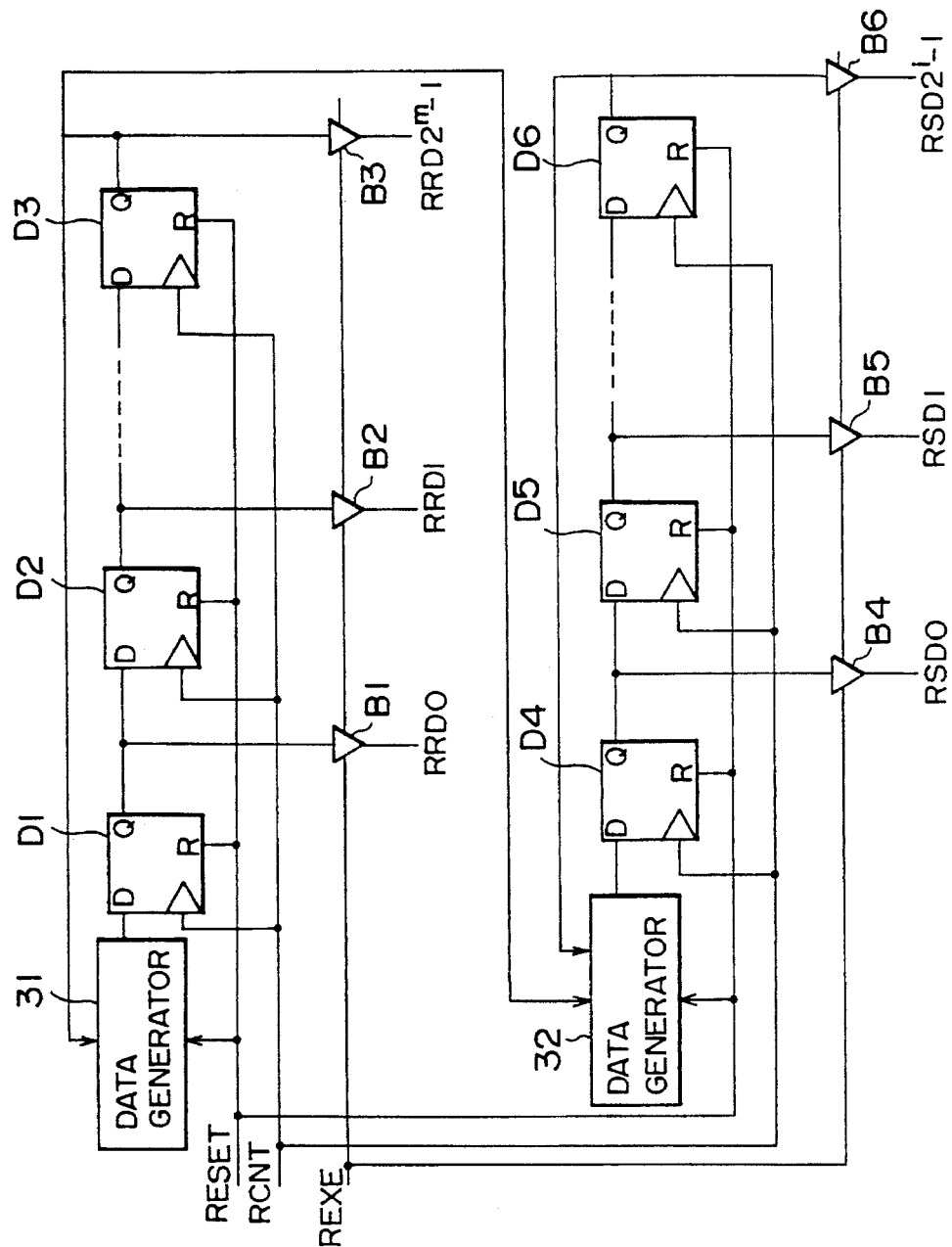
F I G. 11

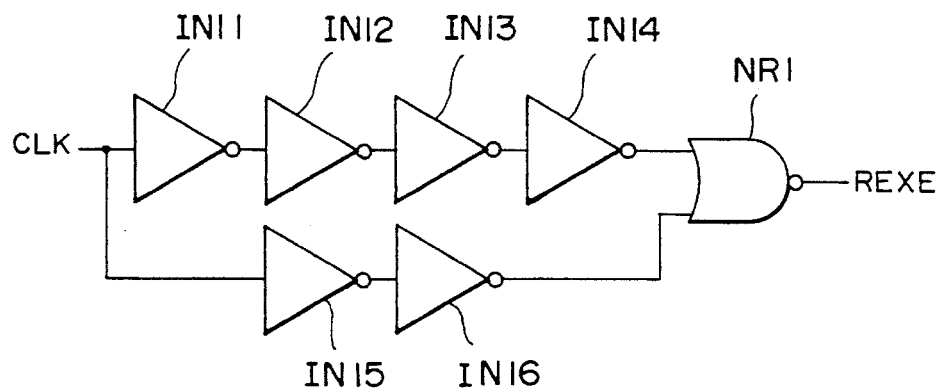
F I G. 12
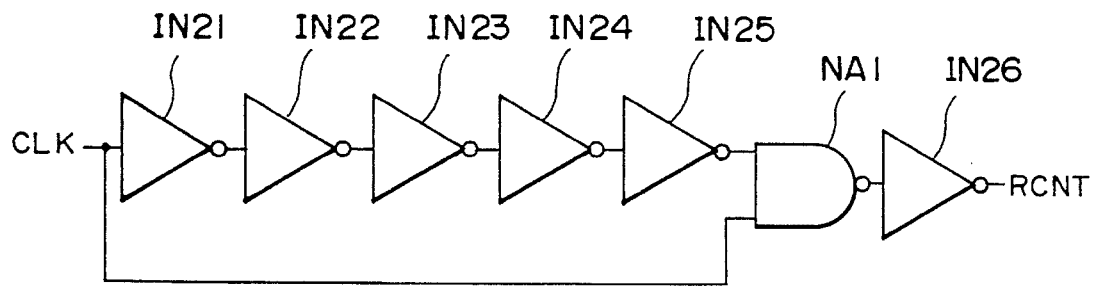
F I G. 13

SEMICONDUCTOR MEMORY DEVICE HAVING REFRESH CIRCUITS

BACKGROUND OF THE INVENTION

This invention relates to a semiconductor memory device, and more particularly to a semiconductor memory including random accessible dynamic memory cells for which refresh operation is required.

As memories in information processing systems such as work stations or personal computers, etc., Random Access Memories (hereinafter referred to as RAMs) are used.

RAM is roughly classified into Dynamic RAM (DRAM) of which memory content is periodically refreshed and Static RAM (SRAM) for which no refresh operation is required.

In recent years, miniaturization and high integration of devices have been developed. As a result, a system on silicon such that many functional units are mounted on the chip to constitute a system has been put into practice. As an example of such a system on silicon, a microcomputer chip can be mentioned. In the microcomputer chip, a logic unit such as a microprocessor unit (hereinafter referred to as MPU) and a memory unit such as a RAM are mounted on a single chip. In this case, if an approach is employed to pursue high integration equivalent to that of a single chip RAM, additional process technology is required for the portion of the memory cell, so manufacturing cost is increased. For example, in a DRAM, when an attempt is made to provide a higher degree of integration, it is necessary to allow a capacitor of a cell to be of trench/stack structure. On the other hand, when an approach is employed to pursue high integration in an SRAM, high resistance polycrystalline silicon as load element and thin film transistor TFT must be formed. As a result, cost is increased.

It is conceivable to use an SRAM in which the memory cell is comprised of six transistors N111–N116 as shown in FIG. 1. However, since an SRAM has a greater number of elements, it is not suitable for implementation of large capacity.

A RAM using four transistor dynamic memory cells comprised of four transistors is shown in FIG. 2. At the time of access, this memory cell drives a bit line BL and /BL by transistors similarly to an ordinary SRAM. For this reason, access time is short as compared to an ordinary DRAM in which capacitive coupling between the memory cell and bit line is used.

Further, holding of data is carried out by using parasitic capacitance (capacitor) attendant to a node within the memory cell or gate capacitance (capacitor) C and junction capacitance (capacitor). However, by leakage current of transistor for drive or leakage current produced at the junction of diffused layer, potential on the node which has held data is lowered. For this reason, periodical refresh is required similarly to an ordinary DRAM.

In DRAM in which memory cells are each comprised of one (1) transistor N101 and one (1) capacitor Cs, the (potential of) word line WL rises at the time of read-out so that the transistor is activated. Thus, the cell capacitor and bit line capacitor are coupled, so potential on bit line BL is changed. This change of potential is amplified and is read out by a sense amplifier. However, data stored in the memory cell is broken simultaneously with read-out operation. For this reason, it is necessary to use a latch type sense amplifier to allow the bit line to undergo positive feedback so that the amplitude is caused to be large to rewrite data into the memory cell for a second time. Further, it is necessary to carry out a similar read-out operation also at the time of refresh to rewrite data into the memory cell.

On the contrary, in a memory cell of a four (4) transistor type DRAM, potential changes (fluctuates) at the time of read-out, but cell data is not broken. Accordingly, there is no necessity to allow the bit line to undergo positive feedback to rewrite data for a second time.

In this case, refresh of the memory cell can be conducted by activating the word line to charge the memory node which holds data through a transfer transistor. It is unnecessary to activate the sense amplifier or to swing the (amplitude of) potential of the bit line to much degree. Accordingly, refresh time is short and power consumption resulting from charge/discharge of the bit line can be held down to low value.

In addition, as compared to an ordinary SRAM constituting a memory cell with six (6) transistors, a load element is unnecessary. Accordingly, the area is small and implementation of high integration can be therefore made.

However, in the memory cell of a four (4) transistor type DRAM, capacitance of the memory node is smaller than that of an ordinary DRAM. Thus, the refresh cycle is short and it is necessary to frequently carry out refresh. As a result, overhead of the refresh cycle is long, so the mean operation speed is lowered.

SUMMARY OF THE INVENTION

Accordingly, an object of this invention is to provide a semiconductor memory device in which the memory cell is constituted with fewer transistors than those of an ordinary SRAM, and there is no overhead in the refresh cycle, so the operation speed can be improved.

A semiconductor memory device of this invention includes dynamic memory cells for which refresh is required, and one fundamental cycle consists of normal operation for carrying out write/read into or from the memory cell and refresh operation. This semiconductor memory device comprises a refresh signal generating circuit supplied with a clock signal from the external to generate a refresh signal indicating start of refresh, a count signal generating circuit supplied with the clock signal to generate a count signal necessary for selection of a memory cell to be refreshed, a refresh counter circuit supplied with the refresh signal outputted from the refresh signal generating circuit and the count signal outputted from the count signal generating circuit to select a word line and a bit line to which the memory cell to be refreshed is connected, and a precharge circuit supplied with the refresh signal outputted from the refresh signal generating circuit to carry out precharge of the bit line for refresh.

When the clock signal is inputted, the refresh signal and count signal are generated. Refresh operation is started by the refresh signal. The count signal is used so that word line and bit line to which the memory cell to be refreshed is connected are selected. As a result, the bit line is precharged. Thus, refresh is carried out. One fundamental cycle is constituted by a refresh operation and normal operation as mentioned above, and periodical refresh is carried out. As described above, refresh operation is incorporated into one fundamental cycle along with normal operation. As a result, there can be no overhead followed by refresh.

BRIEF DESCRIPTION OF THE DRAWINGS

In the accompanying drawings:

FIG. 11 is a circuit diagram the configuration of a row refresh counter and buffer, or a column refresh counter and buffer in the semiconductor memory device according to the embodiment of this invention, FIG. 12 is a circuit diagram showing the configuration of a refresh signal generating circuit in the above-mentioned semiconductor memory device, and FIG. 13 is a circuit diagram showing the configuration of a count signal generating circuit in the above-mentioned semiconductor memory device.

DESCRIPTION OF THE PREFERRED EMBODIMENT

A preferred embodiment of this invention will now be described with reference to the attached drawings.

Figure 1:
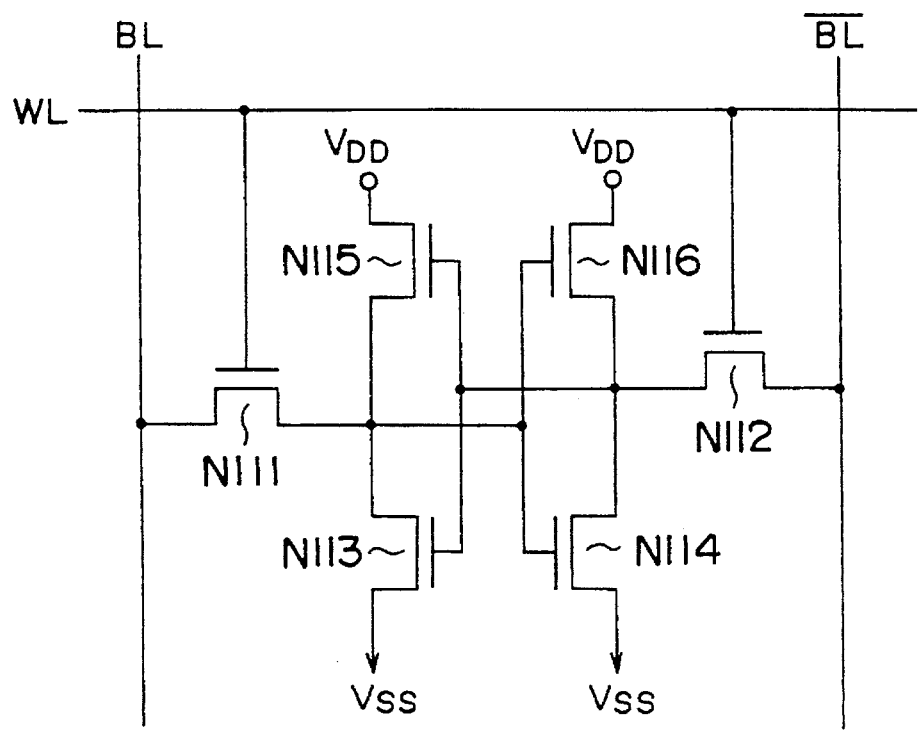
FIG. 1 is a circuit diagram showing the configuration of a memory cell of an SRAM related to this invention.
Figure 2:
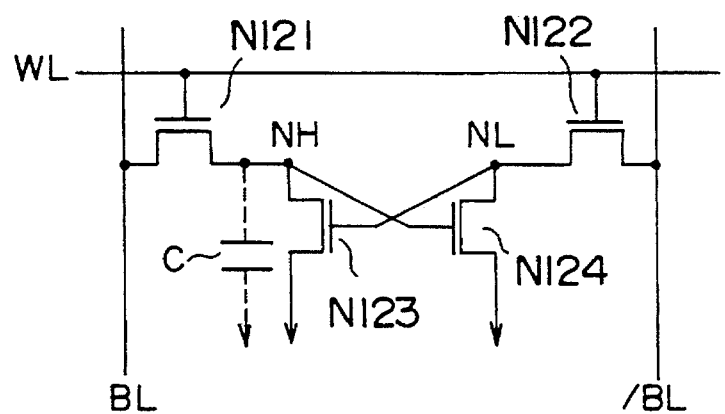
FIG. 2 is a circuit diagram showing the configuration of one memory cell in a semiconductor memory device according to an embodiment of this invention.
Figure 3:
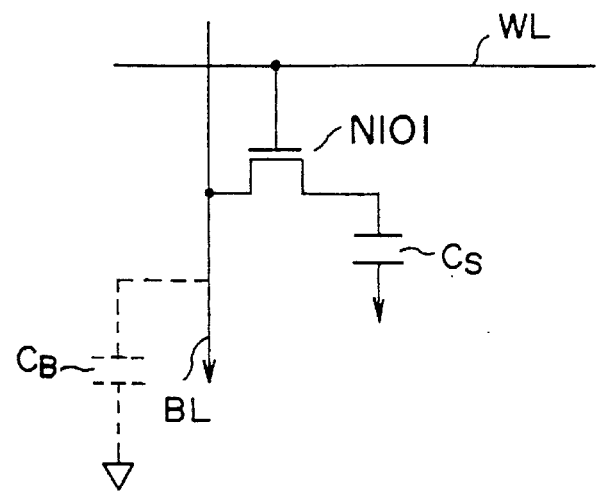
FIG. 3 is a circuit diagram showing the configuration of a memory cell related to this invention, FIGS. 4(a) to (4c) are explanatory views showing the relationship between time elapsed from the time when data is written into the memory cell of FIG. 2 to the time when it is read out therefrom and changes of potentials of the word line, bit line and memory node.

Initially, a semiconductor memory device according to this embodiment includes a memory cell comprised of four N-channel transistors N121–N124 as shown in FIG. 2.

There are provided two N-channel transistors N123 and N124 in which their sources are both grounded and their drains and gates are respectively cross-coupled, and two N-channel transistors N121 and N122 in which their gates are both connected to word line WL, their sources are respectively connected to drains of transistors N123 and N124, and their drains are respectively connected to bit lines BL and /BL.

When bit lines BL and /BL are caused to be at high level and the (potential of) word line WL rises, there results the state where this memory cell is selected. Thus, N-channel transistors N121 and 122 are turned ON.

It is now assumed that data of logic "1" level is held on node NH to which the drain of N-channel transistor N123 and gate of N-channel transistor N124 are connected and data of logic "0" level is held on node NL to which the drain of N-channel transistor N124 and gate of N-channel transistor N123 are connected. At this time, N-channel transistor N124 is turned ON and N-channel transistor N123 is turned OFF. Bit line BL holds (maintains) high level and bit line /BL undergoes a change such that its potential is lowered by the N-channel transistor N124.

The relationship between time tr required from the time when data is written into the memory cell to the time when it is read out therefrom and changes in point of time of potentials of word line WL, bit lines BL, /BL and nodes NH and NL is shown below.

Figure 4A:
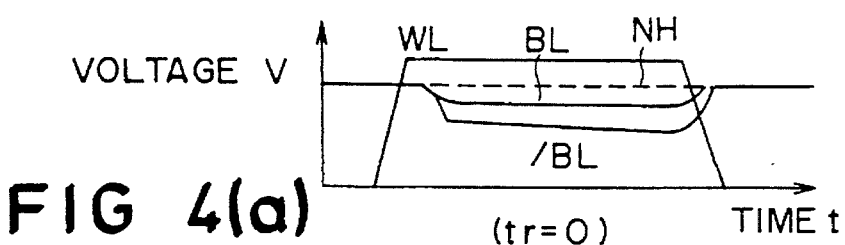

Initially, in the case where data is read out immediately after it is written (time tr=0), and relationship is as shown in FIG. 4(a). Namely, the potential held on memory node NH hardly drops. When the (potential of) word line WL rises, the potential on bit line BL does not so drop to maintain high level, and potential on bit line /BL drops. Thus, data of logic "1" level is read out.

Figure 4B:
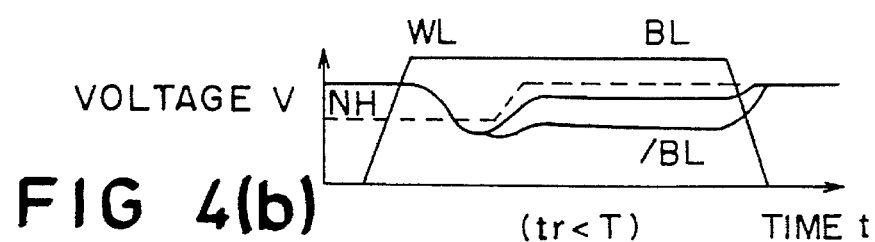

In the case where a certain time is passed from the time when data is written into the memory cell to the time when it is read out therefrom and this time tr is shorter than maximum hold time T, the relationship is as shown in FIG. 4(b). Assuming now that leakage current of transistor is I1, parasitic capacitance of cell node NH or NL is C, threshold voltage of transistors N123 and N124 is Vt, and maximum hold time T is nearly equal to I1/Cæt.

Level of memory node NH is lowered by leakage current. When the (potential of) word line WL rises, the potential of bit line BL is lowered similarly to that of bit line /BL. However, since memory node NH holds necessary level, the level is recovered. Thus, read-out of data can be carried out.

Figure 4C:
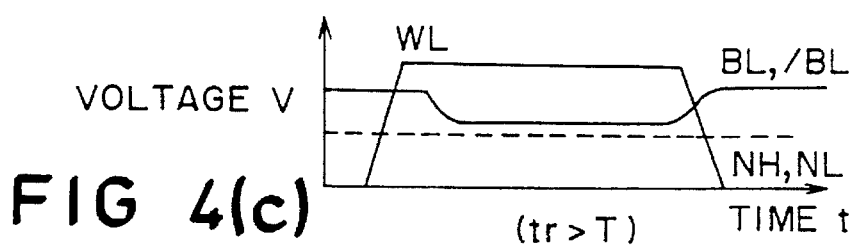

On the other hand, in the case where time tr required until data is read out is above maximum hold time T, the relationship is as shown in FIG. 4(c). Level of node NH is lowered to a greater degree as compared to that at the time point when data is written, and is thus in correspondence with the level of node NL. In the case where the memory has completely vanished, even if the potential of word line WL rises, there is no difference between the potentials of bit lines BL and /BL. Accordingly, read-out of data is impossible. In order to prevent such circumstances, it is necessary to carry out refresh operation within a range which is not above the maximum hold time T after data is written.

Figure 5:
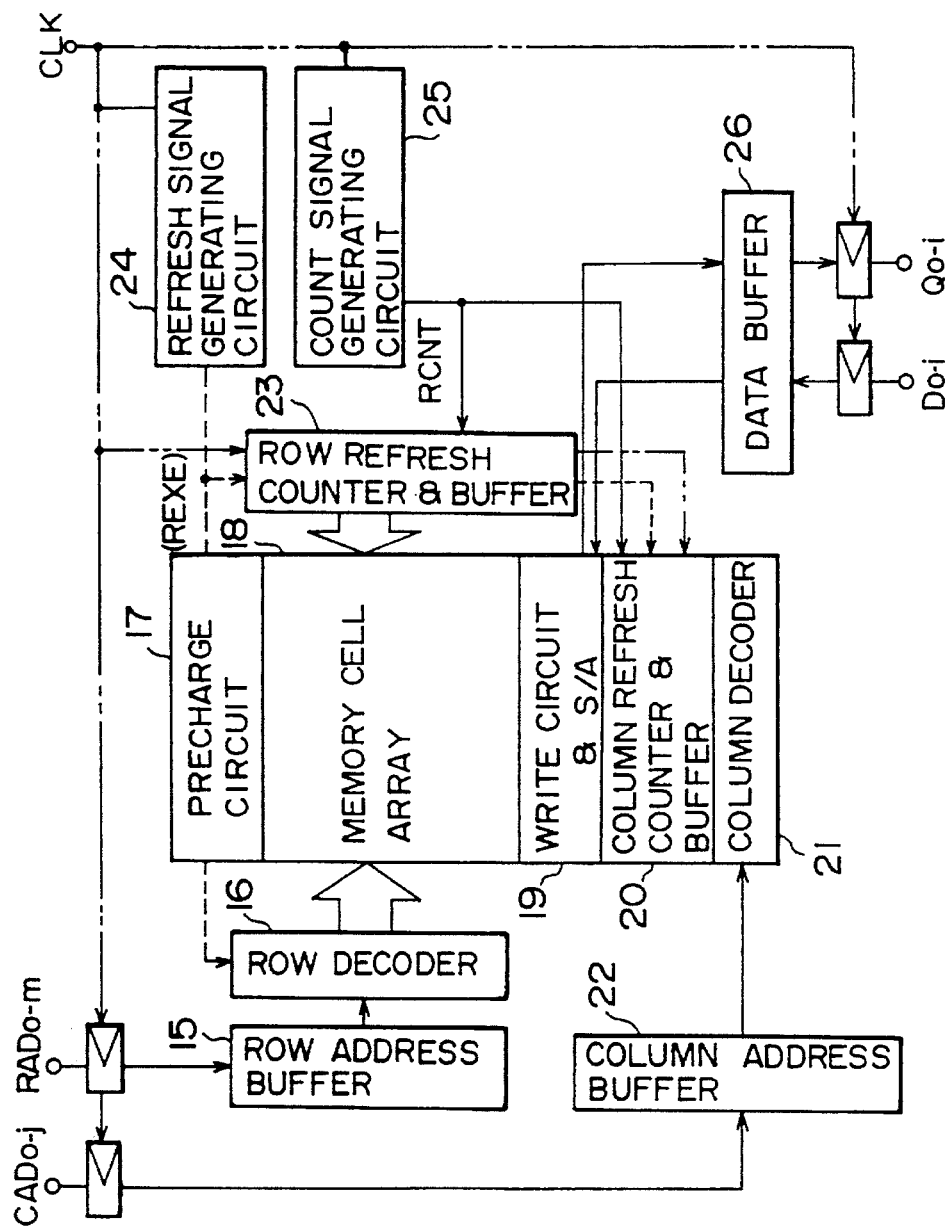
FIG. 5 is a block diagram showing the configuration of a semiconductor memory device according to an embodiment of this invention.

This embodiment permits refresh operation to be carried out at higher speed. Its configuration is shown in FIG. 5. Memory cell array 18 in which memory cells are arranged in matrix form is provided. Row address signal RAD and column address signal CAD are amplified at buffers 15 and 22, and are then decoded at row decoder 16 and column decoder 21, respectively. The decoded signals thus obtained are delivered to memory cell array 18.

Data to be written is amplified at data buffer 26, and is then delivered to write circuit and sense amplifier 19. Thus, this data is written into memory cell selected by row address signal RAD and column address signal CAD.

Figure 6:
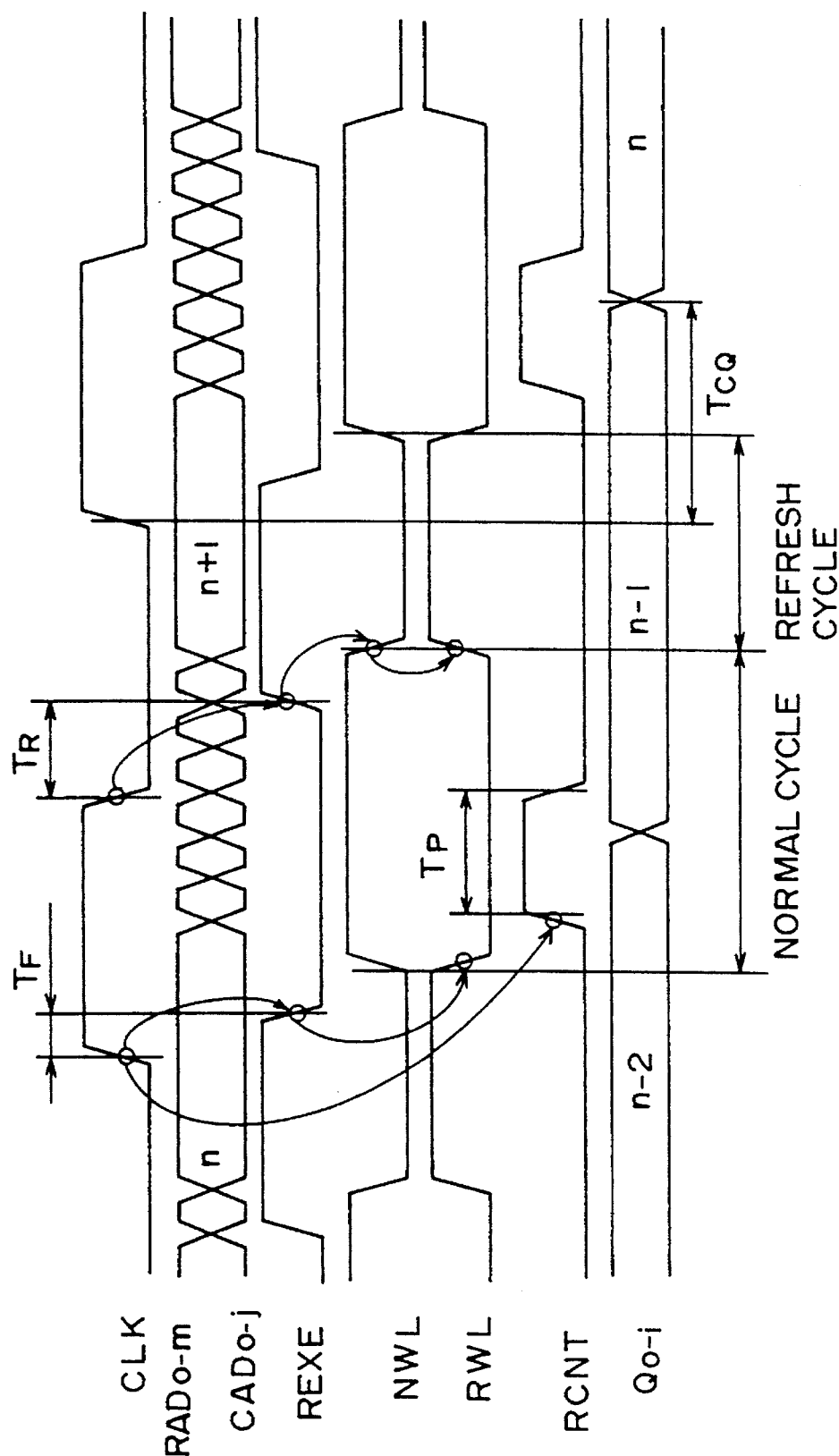
FIG. 6 is a time chart showing waveforms of respective signals in the semiconductor memory device shown in FIG. 5.

In order that this data does not vanish, refresh will be carried out in a manner described below in this embodiment. Time chart of respective signals in the refresh cycle for carrying out refresh operation and the normal cycle for carrying out normal write/read operation is shown in FIG. 6.

The RAM of this embodiment is a RAM of the synchronous type. In this RAM, address signals RAD, CAD are taken thereinto in synchronism with clock CLK inputted from the external. In synchronism with these signals, respective control signals REXE, NWL, RWL, RCNT are generated from corresponding control signal generating circuits.

In this embodiment, refresh cycle is started by the falling edge of clock CLK and normal cycle for carrying out normal read/write operation is started by the rising edge. As stated above, this embodiment is characterized in that one fundamental cycle is divided into refresh cycle and normal cycle at a predetermined ratio so that two operations of refresh and normal operations are carried out in respective cycles.

When clock CLK falls, the refresh cycle starts.

Clock CLK is inputted to refresh signal generating circuit 24 and count signal generating circuit 25. In response to the falling edge of this clock CLK, refresh signal generating circuit 24 outputs refresh active (activation) REXE of high level. Here, the time required from the falling edge of clock CLK to the rising edge of refresh active signal REXE corresponds to refresh signal delay time TR. As described above, one fundamental cycle is divided into normal cycle and refresh cycle at a predetermined ratio to vary this refresh signal delay time TR, thereby making it possible to adjust the ratio between both cycles.

When refresh active signal REXE is delivered to row decoder 16, normal word line select signal NWL required for normal operation changes to low level. Thus, normal address select operation is stopped.

On the other hand, when refresh active signal REXE of high level is inputted to row refresh counter and buffer 23, refresh word line select signal RWL changes to high level. In this way, at the time of refresh operation, the word line is selected by refresh counter and buffer 23.

Moreover, clock CLK is also delivered to count signal generating circuit 25. In synchronism with rising edge of clock CLK, the count signal generating circuit 25 outputs refresh counter shift signal RCNT. Since this refresh counter shift signal RCNT allows refresh system to be higher, refresh operation is carried out in parallel to normal access operation in the normal cycle. This refresh counter shift signal RCNT is delivered to row refresh counter and buffer 23. Thus, refresh word line select signal RWL is generated so that word lines WL to which memory cells to be refreshed are connected are sequentially selected.

Further, when refresh active signal REXE of high level is outputted, bit lines BL and /BL to which the memory cell to be refreshed is connected are selected by column refresh counter and buffer 20. As stated above, at the time of refresh, the memory cell is selected by the row refresh counter and buffer 23 and the column refresh counter and buffer 20. Thus, refresh is carried out.

Further, precharge circuit 17 serves to carry out necessary precharge also in the refresh cycle similarly to the normal cycle. This precharge circuit 17 is supplied with refresh active signal REXE to precharge bit line BL so that its potential is at high level.

When clock CLK rises, the normal cycle starts. Refresh active signal REXE outputted from refresh signal generating circuit 24 changes to low signal. As a result, refresh word line select signal RWL is stopped to be outputted. From row decoder 16, normal word line select signal RWL is outputted. Normal access is carried out with respect to word line WL selected by signal RWL and bit line BL selected by column decoder 21.

Figure 7:
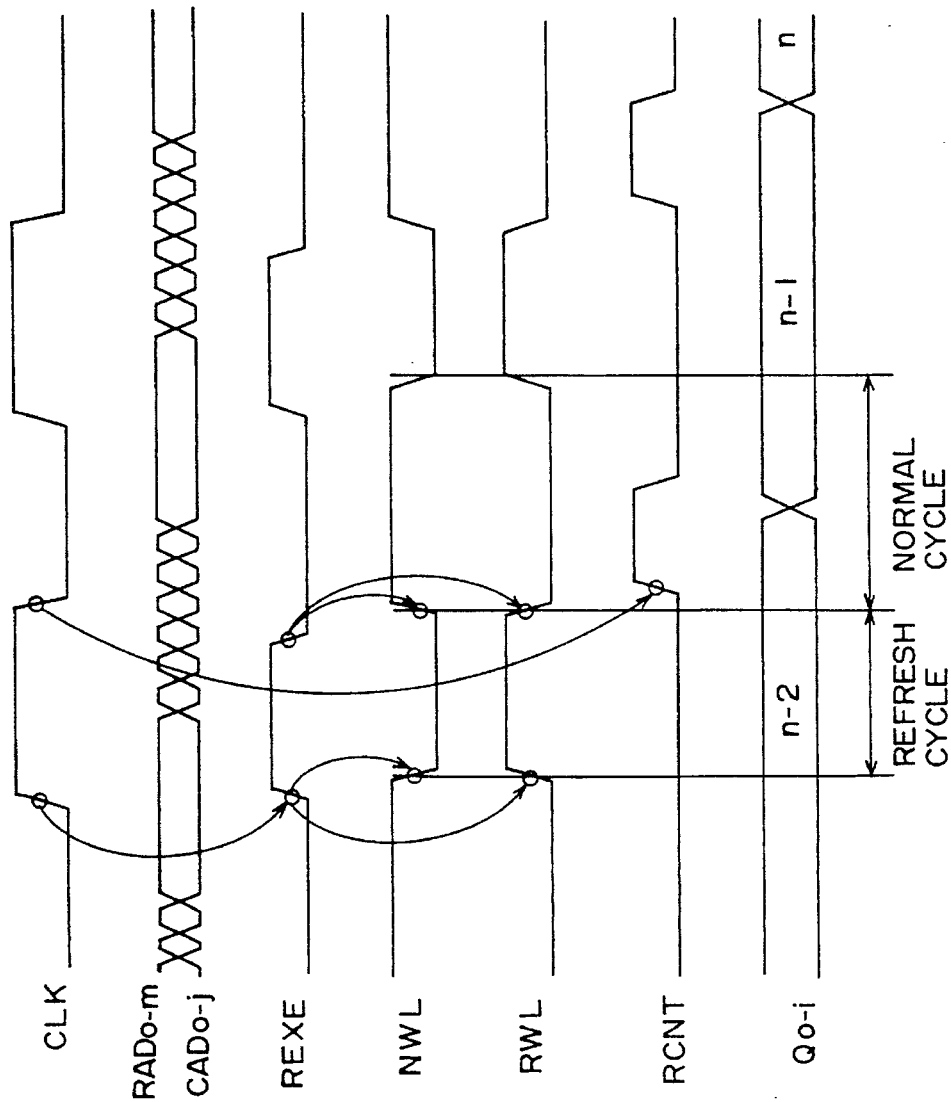
FIG. 7 is a time chart showing waveforms of respective signals in a semiconductor memory device according to another embodiment of this invention.

While, in this embodiment, the refresh cycle is started in response to the falling edge of clock CLK, the refresh cycle may be started in response to the rising edge of clock CLK in a manner opposite to the above. Time chart in this case is shown in FIG. 7. When clock CLK rises, refresh active signal of high level is outputted. Thus, the refresh cycle starts. Normal address select operation is stopped. As a result, the memory cell is selected by the row refresh counter and buffer 23 and the column refresh counter and buffer 20. Thus, refresh is carried out. In the normal cycle, address, etc. inputted in response to rise is taken in and decoder is used to carry out normal access when signal REXE shifts to low level. When clock CLK falls, the refresh counter shift signal RCNT for the next refresh is outputted.

An ordinary semiconductor memory device carries out normal operation and refresh operation without correlation one after another in respective different cycle. On the contrary, this embodiment constitutes one fundamental cycle by normal cycle and refresh cycle to periodically carry out refresh operation every respective cycle. As stated above, the refresh operation is incorporated into one fundamental cycle along with normal operation. Thus, overhead followed by refresh can be eliminated. Accordingly, there is no possibility that the circuit of this embodiment undergoes restrictions on refresh similarly to an ordinary SRAM. Further, additional circuit units such as refresh controller, etc. are unnecessary. Thus, cost is reduced.

Further, the memory cell is constituted with transistors less than those of an SRAM. Furthermore, since no load element is necessary, implementation of high integration can be made. In addition, since cell data is not broken at the time of read-out, refresh time is shortened and operation is caused to be higher as compared to an ordinary DRAM.

Further, in accordance with this embodiment, in the case where the semiconductor memory device according to this invention is mounted as a memory unit along with logic unit on a single chip, any additional process technology is unnecessary in realization of high integration. Thus, process required for the circuit of this embodiment has good matching (consistency) with ordinary process required for a logic unit. This contributes to reduction of cost.

Figure 8:
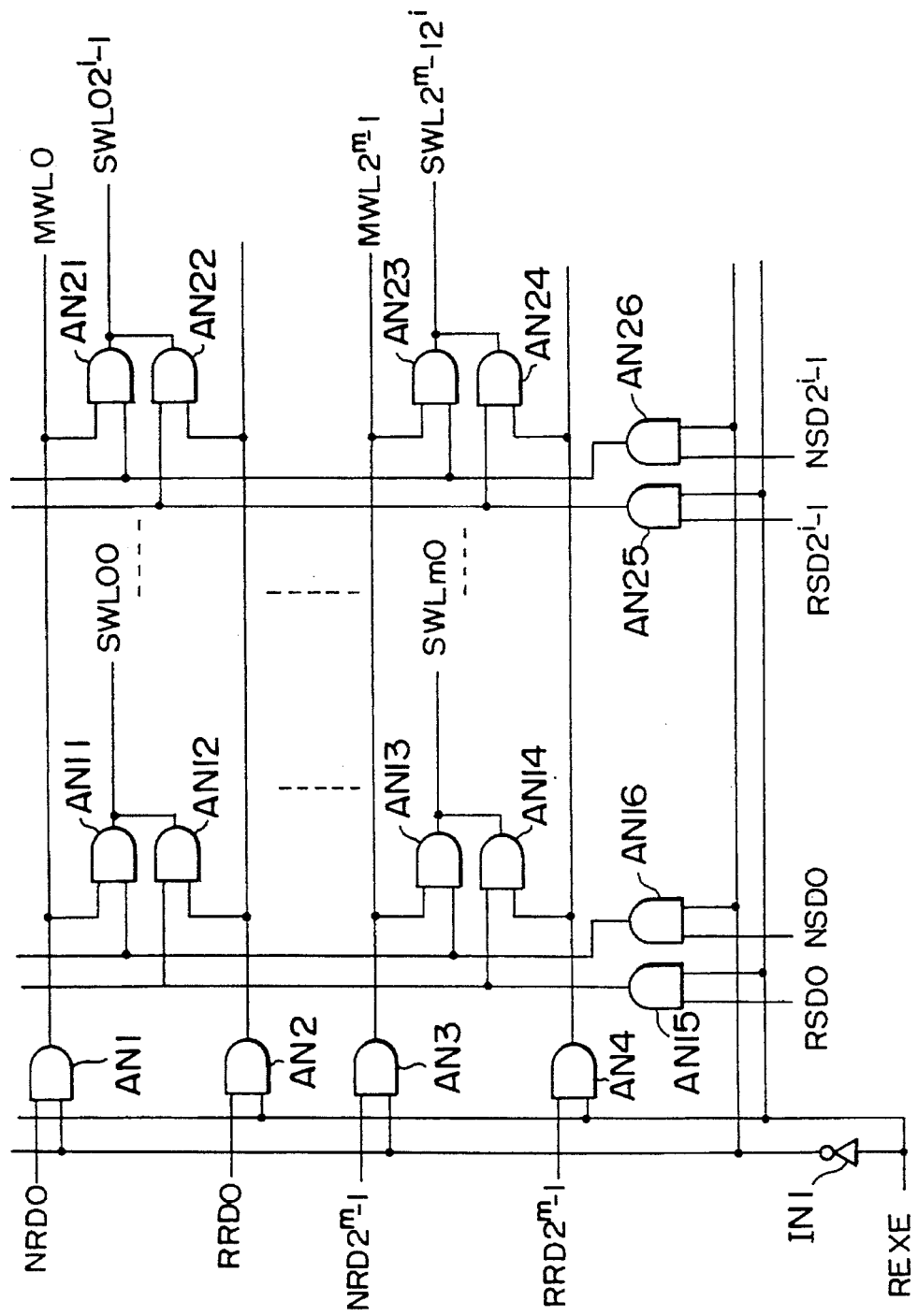
FIG. 8 is a circuit diagram showing the configuration of a word line drive circuit in the semiconductor memory device according to the embodiment of this invention.

An actual configuration of a circuit for driving word line WL in this embodiment is shown in FIG. 8. This word line drive circuit serves to select refresh row decoder signal $RRD0-RRD2^m-1$ outputted from row refresh counter and buffer 23 used at the time of refresh and normal row decoder signal $NRD0-NRD2^m-1$ outputted from row decoder 16 decoder signal $NRD0-NRD2_m-1$ outputted from row decoder 16 used at the time of normal operation in dependency upon refresh active signal REXE to output the selected signal to drive word line WL.

Refresh active signal REXE is inputted to input terminals of AND gates AN2 and AN4, and refresh active signal /REXE inverted by inverter IN1 is inputted to input terminals of AND gates AN1 and AN3. At the time of refresh cycle, refresh active signal REXE is at high level. As a result, refresh row decoder signals RRD0 to $RRD2m-1$ are selectively outputted from AND gates AN2, AN4, . . . In contrast, at the time of normal cycle, refresh active signal REXE is at low level. As a result, normal row decoder signals $NRD0-NRD2^m-1$ are selectively outputted.

This word line drive circuit is used in the case where word lines are driven every section. To AND gate AN15 and AN25, refresh section decoder signals $RSD0-RSD2^i-1$ are inputted along with refresh active signal REXE. To AND gates AN16 and AN26, refresh active signal REXE and normal section decoder signals $NSD0-NSD2_i-1$ are inputted. At the time of refresh, refresh section decoder signals $RSD0-RSD2^i-1$ are selectively outputted, and are inputted to one input terminal each of AND gates AN12, AN14, AN22 and AN24. To the other input terminal of these respective AND gates AN12, AN14, AN22 and AN24, the above-described refresh row decoder signals RRD0–RRD2$^m$–1 are inputted. As a result, corresponding one of refresh row decoder signals RRD0–RRD2$^i$–1 is outputted only to word line WL of the section selected by any one of the refresh section decoder signals RSD0–RSD2$^i$–1. The corresponding word line WL is driven. At the time of normal operation, corresponding one of normal row decoder signals NRD0–NRD2$^m$–1 is outputted to word line WL of the section selected by any one of normal section decoder signal NSD0–NSD2$^i$–1.

Figure 9:
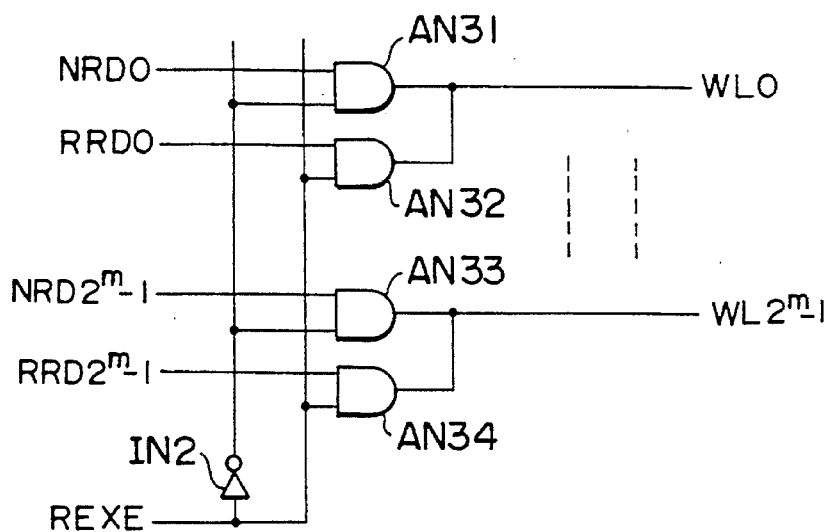
FIG. 9 is a circuit diagram showing another configuration of the word line drive circuit.

In the case where word line WL is not divided every section, a word line drive signal as shown in FIG. 9 may be used. In accordance with this circuit, any ones of refresh row decoder signals RRD0–RRD2$^m$–1 and normal row decoder signals NRD0–NRD2$^m$–1 are selected by AND gates AN31 AN34, and are outputted to word lines WL0–WL2$^m$–1.

Figure 10:
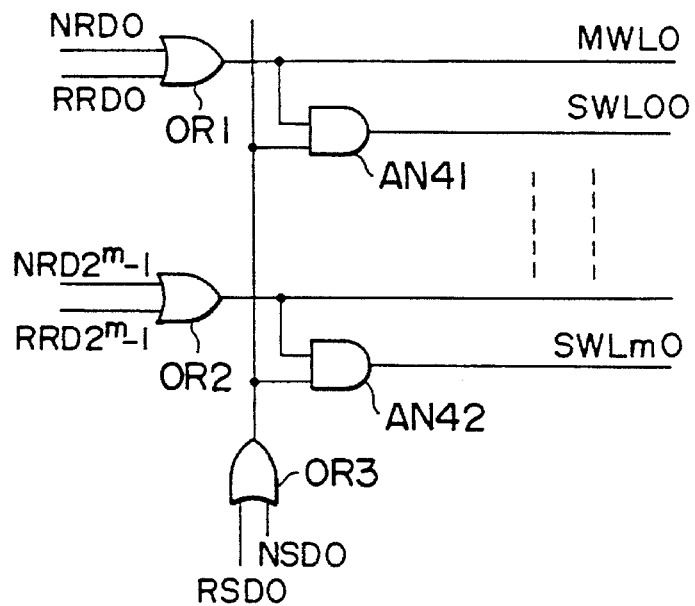
FIG. 10 is a circuit diagram showing a further configuration of the word line drive circuit.

The word line drive circuit shown in FIG. 10 is of a structure in which word line WL is divided every section. Without use of refresh active signal REXE, any ones of refresh row decoder signals RRD0–RRD2$^m$–1 and normal row decoder signals NRD0–NRD2$^m$–1 are outputted. Namely, when any one of refresh row decoder signal RRD0 and normal row decoder signal NRD0 is inputted to OR gate OR1, this signal is outputted, and is then delivered to one input terminal of AND gate AN41. Further, when any one of refresh section decoder signal RSD0 and normal section decoder signal NSD0 is inputted to OR gate OR3, this signal is outputted, and is inputted to the other input terminal of AND gate AN41. In the case where this section is selected by refresh section decoder signal RSD0 or normal section decoder signal NSD0, any one of refresh row decode signal RRD0 and normal decoder signal NRD0 is outputted to section word line SWL00.

While examples of configurations of word line drive circuits are shown in FIGS. 8 to 10, the bit line drive circuit may be of similar structure.

An example of the configuration of row refresh counter and buffer 23, and column refresh counter and buffer 20 is shown in FIG. 11. This circuit configuration is of the shift register type so as to permit count operation to be carried out at a higher speed.

By data generator 31, D flip-flops D1–D3 and buffers B1 to B3, refresh row decoder signals RRD0–RRS2$^m$–1 are generated. By data generator 32, D flip-flops D4–D6 and buffers B4–B6, refresh section decoder signals RSD0 to RSD2$i$–$1$ are generated.

Reset signal RESET is inputted to data generators 31 and 32 and reset terminals R of D flip-flops D1–D6 and are initialized. From data generators 31 and 32, data of logic "1" level is inputted as initial data with respect to the initial bit to data terminals D of the first D flip-flop and the fourth D flip-flop D4. At this time point, output terminals Q of respective D flip-flops D2 and D3, and D5 and D6 are at logic "0" level.

When refresh counter shift signal RCNT is inputted to clock terminals of D flip-flops D1 to D6, data of logic "1" are sequentially transferred from output terminals Q of D flip-flops D1 to D4 to the succeeding stage. Input terminals of buffers B1–B6 are connected to output terminals Q of respective D flip-flops D1–D6. When refresh signal REXE is inputted to control terminals of these buffers B1–B6, data respectively delivered from D flip-flops D1 to D6 are amplified. As a result, refresh row decoder signals RRD0–RRD2$^m$–1 and refresh section decoder signals RSD0–RSD2$^i$–1 are outputted. Thus, word line WL or bit line BL of bit in which data of logic "1" level is outputted is selected.

The configuration of a refresh signal generating circuit according to this embodiment is shown in FIG. 12. This refresh signal generating circuit is used in the case where refresh cycle starts in synchronism with fall of clock CLK and normal cycle starts in synschronism with the rising edge. As shown in FIG. 6, refresh active signal REXE falls in a manner delayed by time TF from the rise of clock CLK, and refresh active signal REXE rises in a manner delayed by time TR from the fall of clock CLK. To input terminal supplied with clock CLK, inverter train including even stages of inverters IN11 to IN14 connected in series and inverter train including even stages of inverters IN15 and IN16 connected in series are connected in parallel. Output sides of inverters IN14 and IN16 are connected to NOR gate NR1, and refresh active signal REXE is outputted from output side of this NOR gate NR1. In this refresh signal generating circuit, clock CLK is delayed by time TF by inverters IN11–IN14, and clock CLK is delayed by time TR by inverters IN15 and IN16.

The circuit configuration of the refresh signal generating circuit is not limited to the configuration shown in FIG. 12. For example, a CR delay circuit, etc. may be used in place of inverters as means for delaying clock CLK.

The configuration of count signal generating circuit according to this embodiment is shown in FIG. 13. It is now assumed that, also in this case, the refresh cycle starts in synchronism with fall edge of clock CLK and normal cycle starts in synchronism with rise edge. As shown in FIG. 6, refresh counter shift signal RCNT rises in response to rise of clock CLK, and then falls with a pulse width of time TP. To input temrinal supplied with clock CLK, the odd stages of inverters IN21–IN25 for delaying clock CLK by time TP are connected. The output side of inverter IN25 and the input terminal are connected to the input side of NAND gate NA1. The signal outputted from NAND gate NA1 is inverted by inverter IN26, and is then outputted as refresh counter shift signal RCNT from the output terminal.

The configuration of this count signal generating circuit is not similarly limited to the configuration of FIG. 13.

Further, in the case where the order of refresh cycle and normal cycle is opposite to the above, i.e., in the case normal cycle starts in synchronism with the falling edge of clock CLK and refresh cycle starts in synchronism with the rising edge as shown in FIG. 7, circuits obtained by respectively modifying the above-described configurations may be used as refresh signal generating circuit and count signal generating circuit. For example, the refresh signal generating circuit is basically the same as the circuit configuration of FIG. 12. Namely, such a circuit may be realized by making adjustments by using inverter train or CR delay circuits, etc. so that time delay for clock CLK becomes equal to a desired value. In addition, count signal generating circuit may be realized by replacing the inverter train comprised of inverters IN21–IN25 by an inverter train of the even stages of inverters, and connecting the odd number of inverters to the portion connected to the input side of NAND gate NA1 from the input terminal.

The above-described emboidments are presented only for illustrative purpose and do not therefore limit this invention in any sense. For example, e.g., the refresh counter circuit has a configuration as shown in FIG. 11 in the embodiment, but is not limited to this implementation. Any circuit configuration supplied with a count signal to sequentially select word lines and bit lines to which a memory cell to be refreshed is connected may be employed.

What is claimed is:

1. A semiconductor memory device including dynamic memory cells for which refresh operation is required, wherein one fundamental cycle consists of a normal operation for carrying out writing or reading into or from said memory cells and a refresh operation, said semiconductor memory device comprising:

a refresh signal generating circuit supplied with a clock signal to generate a refresh signal indicating start of refresh;

a count signal generating circuit supplied with said clock signal to generate a count signal required for selection of a memory cell to be refreshed;

a refresh counter circuit supplied with said refresh signal outputted from said refresh signal generating circuit and said count signal outputted from said count signal generating circuit to select a word line and a bit line to which a memory cell to be refreshed is connected; and a precharge circuit supplied with said refresh signal outputted from said refresh signal generating circuit to carry out precharge of said bit line for refresh.

2. A semiconductor memory device as set forth in claim 1, wherein said normal operation is started by edge of one phase of a clock signal inputted from the external, and said refresh operation is started by an edge of antiphase of said clock signal.

3. A semiconductor memory device as set forth in claim 1, wherein said dynamic memory cell comprises first and second MOS transistors in which their sources are both connected to a first power supply voltage terminal and their drains and gates are respectively cross-coupled, and third and fourth MOS transistors in which their gates are both connected word lines, their drains are respectively connected to ones of bit line pairs, and their sources are respectively connected to drains of said first and second MOS transistors.

4. A semiconductor memory device as set forth in claim 3, wherein said normal operation is started by edge of one phase of a clock signal inputted from the external, and said refresh operation is started by edge of antiphase of said clock signal.

* * * * *